United States Patent [19]
Takamoto et al.

[11] Patent Number: 5,378,950
[45] Date of Patent: Jan. 3, 1995

[54] SEMICONDUCTOR INTEGRATED CIRCUIT FOR PRODUCING ACTIVATION SIGNALS AT DIFFERENT CYCLE TIMES

[75] Inventors: Hiroshi Takamoto, Tokyo; Mikio Etou, Yokohama, both of Japan

[73] Assignee: Kabushiki Kaisha Toshiba, Kawasaki, Japan

[21] Appl. No.: 829,473

[22] Filed: Feb. 3, 1992

[51] Int. Cl.⁶ .................... H03K 17/28; H03K 5/159
[52] U.S. Cl. .................... 327/401; 327/403; 327/396; 327/295
[58] Field of Search .................. 328/75, 105; 307/592, 307/596, 597, 590, 591, 595, 443, 269, 262

[56] References Cited
U.S. PATENT DOCUMENTS

| | | | |
|---|---|---|---|
| 3,050,713 | 8/1962 | Harmon | 307/244 |
| 4,112,380 | 9/1978 | Thatcher | 307/262 |
| 4,417,158 | 11/1983 | Ito et al. | 307/269 |
| 4,617,477 | 10/1986 | DePaolis, Jr. | 307/269 |
| 4,626,716 | 12/1986 | Miki | 307/590 |
| 4,761,568 | 8/1988 | Stronski | 307/269 |
| 4,843,263 | 6/1989 | Ando | 328/75 |
| 4,877,974 | 10/1989 | Kawai et al. | 307/269 |
| 5,047,659 | 9/1991 | Ullrich | 307/269 |
| 5,073,730 | 12/1991 | Hoffman | 307/269 |

FOREIGN PATENT DOCUMENTS

| | | | |
|---|---|---|---|
| 0148426 | 8/1984 | Japan | 307/443 |
| 0130920 | 7/1985 | Japan | 307/443 |

OTHER PUBLICATIONS

Horowitz et al. "The Art of Electronics", Cambridge University Press, 1980, pp. 336 and 341-342.

*Primary Examiner*—Timothy P. Callahan
*Assistant Examiner*—Toan Tran
*Attorney, Agent, or Firm*—Foley & Lardner

[57] ABSTRACT

A semiconductor integrated circuit has n number of operating circuits that each operate at a predetermined cycle time; n number of wirings that transmit activation signals with respect to said n number of wirings; and a selector drive circuit that sends activation signals to said n number of wirings at respectively different cycle times. By avoiding the simultaneous drive of the operation circuits, the widths of wirings are maintained.

2 Claims, 3 Drawing Sheets

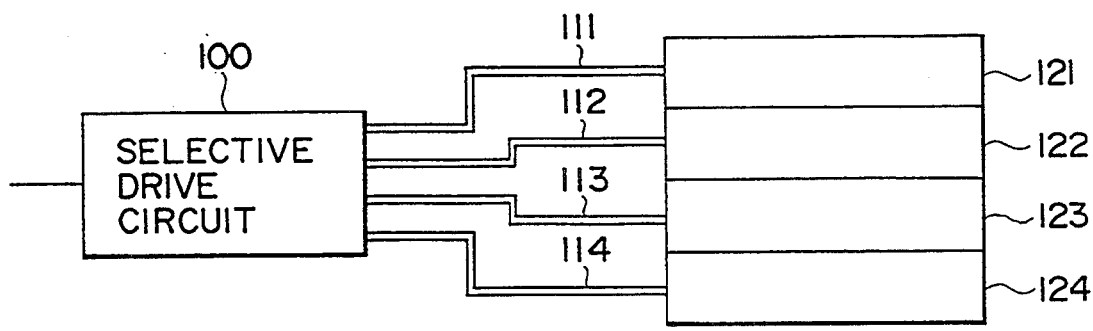
F I G. 5A
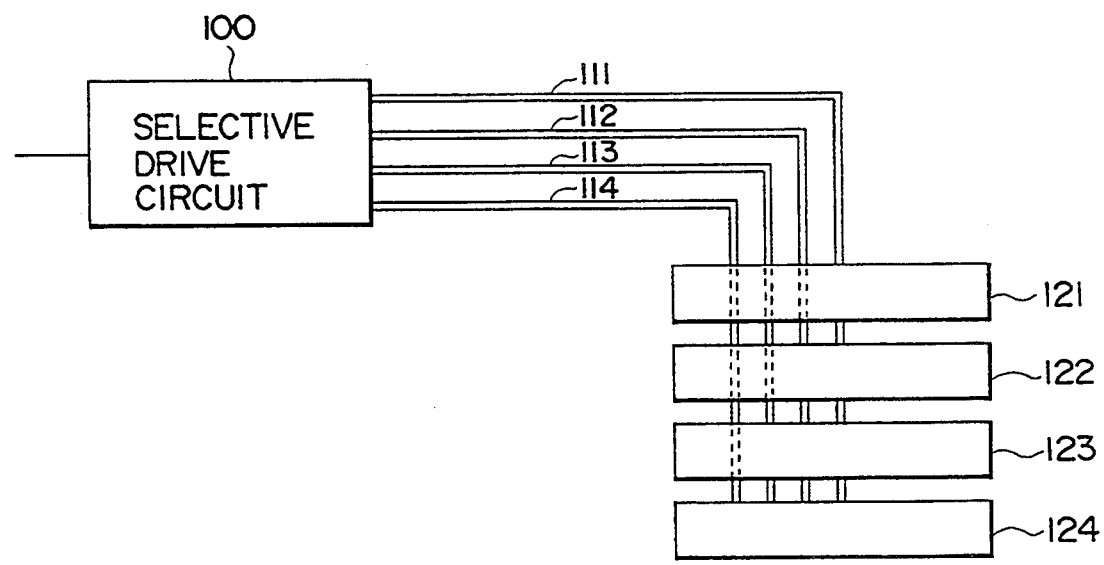
F I G. 5B

SEMICONDUCTOR INTEGRATED CIRCUIT FOR PRODUCING ACTIVATION SIGNALS AT DIFFERENT CYCLE TIMES

BACKGROUND OF THE INVENTION

The present invention relates to semiconductor integrated circuits and, more particularly, to semiconductor integrated circuits which include many wiring portions, such as signal lines, along which flow large AC currents.

In general, memory circuits and microcomputer circuits and the like are supplied activation signals to required portions inside a circuit at a required predetermined cycle time, and are designed so that they operate while activation is being performed. With recent large scale and high speed semiconductor integrated circuits, there is a tendency of reducing this cycle time.

These circuits are normally designed so that the activation signals sent for each cycle time are transmitted via metal wiring, so as to reduce the transmission loss but the width of this metal wiring is becoming finer, with increasing fineness with larger scales and higher speeds.

Furthermore, along with higher speeds there is an increase in the charging and discharging mean current of the signal lines that are configured from metal wiring, coupled with the increasing fineness of the metal wiring, this raises the current density of the current that flows in the metal wiring, and causes problems of reliability of the metal wiring.

Conventional means for lowering the current density so as to counter this deterioration in reliability include widening the width of the metal wiring and having a plural number of metal wires and performing simultaneous drive.

FIG. 1 is a timing chart for describing the transmission timing of general activation signals. This timing chart shows the output for each cycle of activation signals P by an activation circuit that operates by a cycle time (t1). In this figure, the external signal input is, for example, an address input, and the internal signal is, for example, an address transition detection signal. The circuit to which these activation signals P are transmitted is activated in response to these activation signals, and performs charge and discharge.

FIG. 2 is a view showing the structure of wiring 11 that transmits the activation signals P generated by the activation circuit 10. The wiring 11 has a length L and a width W, and has a capacitance CS of the wiring itself and a capacitance CG of the gates and the like of a transistor that configures an operation circuit (not shown in the figure) and that is connected to the wiring. Accordingly, when the activation signals P are transmitted from the activation circuit 10, there may be a problem of the charge and discharge of the capacitances CS and CG.

The mean current ai in one cycle of the wiring 11 that transmits these activation signals P becomes a value ($ai = It1/t1$) that is the charge and discharge current It1 divided by the cycle time t1 and so there is an increase in the mean current ai as the cycle time t1 becomes shorter, and the current density ai/W (which is a value of ai divided by the wiring width W) of the wiring 11. This decreases reliability.

Shown in FIG. 3 is one measure for increasing the reliability where the width of the wiring itself increased to W' in the new wiring 11' in order to compensate the increase of the mean current ai. However, with this method, the increased wiring width portion also increases the capacitance of the wiring 11' itself so that it becomes CS'. This means that the charge and discharge current increases from It1 to It1' with respect to the increased capacitance, which must also be considered.

As one example, the following considers the case where the capacitance ratio of the capacitances CS and CG is 1:2, and where the cycle time t1 is shortened to ½. At this time, the mean current ai doubles and the wiring current density through the wiring also doubles. Accordingly, if the wiring is made larger so that doubled charge and discharge currents flow, then current density conditions that are equivalent to these before the mean current increase will be obtained. On the other hand, the charge and discharge current density for a required voltage becomes a value ($I \cdot t = C \cdot V$) which is proportional to the capacity. Thus, the capacitance ($CS' + CG$) of the wiring $W' \times L$ can become twice the original capacitance ($CS + CG$). Accordingly, in this case, the condition above is satisfied when the capacitance ratio CS':CG becomes 4:2, and it is necessary to have four time the original wiring width W. Because of this, it is necessary to obtain such wide wiring space if the method of FIG. 3 is applied.

In addition, in the condition where the cycle time has become ½, measures to reduce the charge and discharge current by compensating the mean current increase by dividing the capacitance of the wiring are proposed. As shown in FIG. 4, this method involves dividing the wiring 11 into n number or portions of wiring 12-1 through 12-n when the length L and the width W of the wiring 11 are maintained constant, and by providing activation signal supply circuits with respect to the respective wiring 12-1 through 12-n as activation circuits 10-1 through 10-n as shown in FIG.4 and then performing simultaneous drive.

In this case, the mean current ($It1/n$) that flows through a single divided wiring C can be ½ and so when the capacitance ($CS + CG/n$) of the wiring C has become ½, the current density conditions are equivalent to those prior to the mean current increase.

These conditions are satisfied when the capacitance ratio CS:CG/n is 1:0.5 and it is necessary to divide the capacitance CG into four parts. Because of this, it is necessary to have an even wider wiring space than for the measure shown in FIG. 3.

SUMMARY OF THE INVENTION

Accordingly, it is an object of the present invention to provide a semiconductor integrated circuit that improves the reliability of metal wiring along which flows a large AC current, without any deterioration in miniaturization and operation speed.

According to the present invention there is provided a semiconductor integrated circuit comprising: n number of operating circuits that operate at a predetermined cycle time; n number of wirings that transmit activation signals with respect to said n number of wirings; and a selector drive circuit that sends activation signals to said n number of wirings at respectively different cycle times.

With the present invention, n number of wirings that transmit activation signals are provided, and the respective wirings are successively driven at different cycles using delay elements by a selector drive circuit. Accordingly, there is no simultaneous drive of the wirings at each cycle, and it is not necessary to divide the capacitance caused in the drive circuit, nor is it necessary to have a wide wiring space.

BRIEF DESCRIPTION OF THE DRAWINGS

In the accompanying figures,

FIGS. 5A and 5B are block diagrams showing an outline configuration of an embodiment of the present invention;

DESCRIPTION OF THE PREFERRED EMBODIMENTS

An embodiment of the present invention will be described with reference to the appended drawings.

FIGS. 5A and 5B are block diagrams showing an outline of the configuration of a semiconductor integrated circuit device according to the present invention. As is shown in FIGS. 5A and 5B, this semiconductor integrated circuit device has the four drive circuits 121–124, and to these are connected the selector drive circuit 100 via the respective wirings 111–114. This selector drive circuit 100 receives an internal signal input, and transmits activation signals at a different cycle for each wiring.

Figure 1:
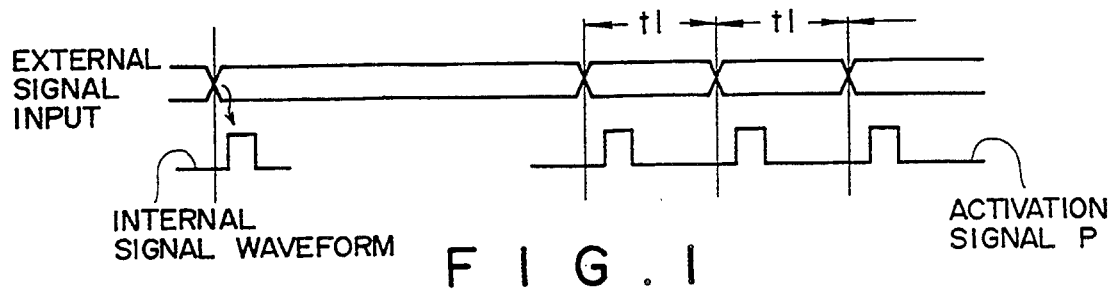
FIG. 1 is a timing chart for describing the transmission timing of general activation signals.
Figure 2:
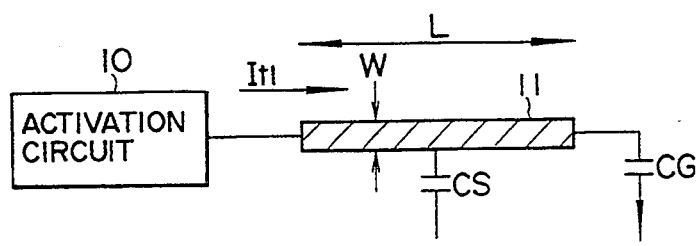
FIG. 2 is a view that shows the conventional structure of wiring that transmits activation signals generated by an activation circuit.
Figure 3:
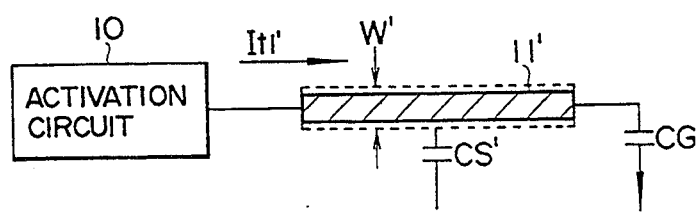
FIG. 3 is a conventional wiring structure that transmits activation signals generated by an activation circuit.
Figure 4:
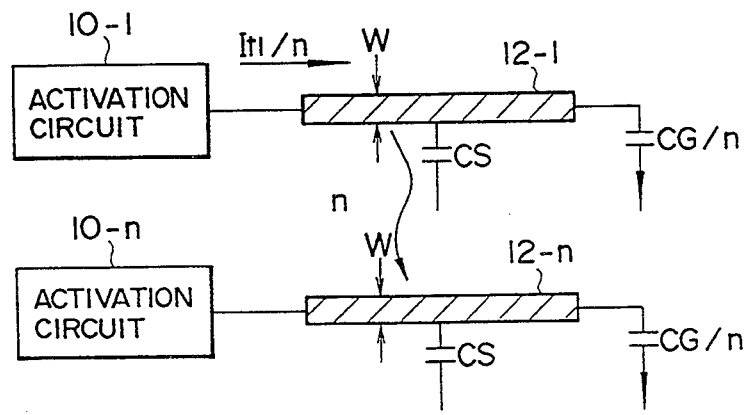
FIG. 4 is a view describing the conventional method of the reducing the mean current of wiring.
Figure 6:
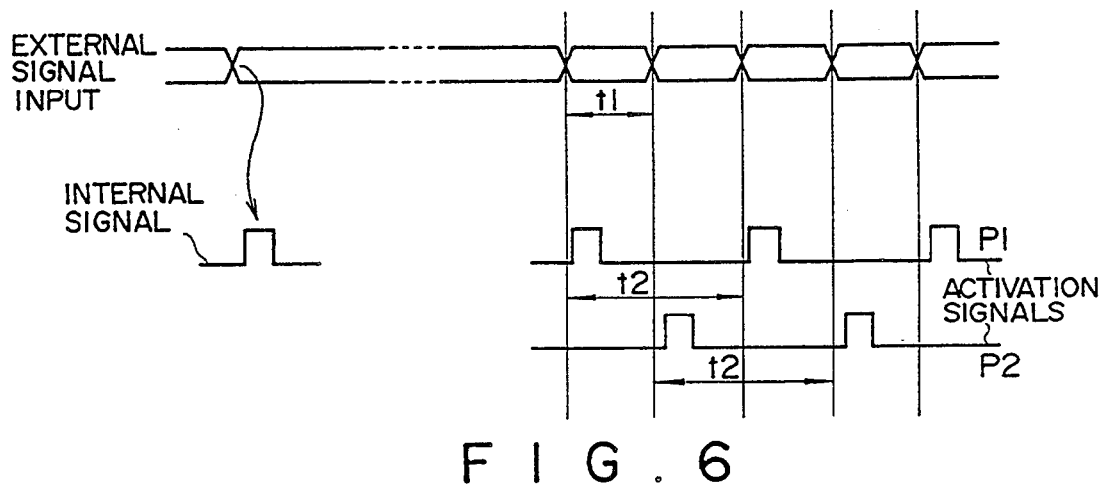
FIG. 6 is a timing chart showing the situation for transmission of activation signals.
Figure 7:
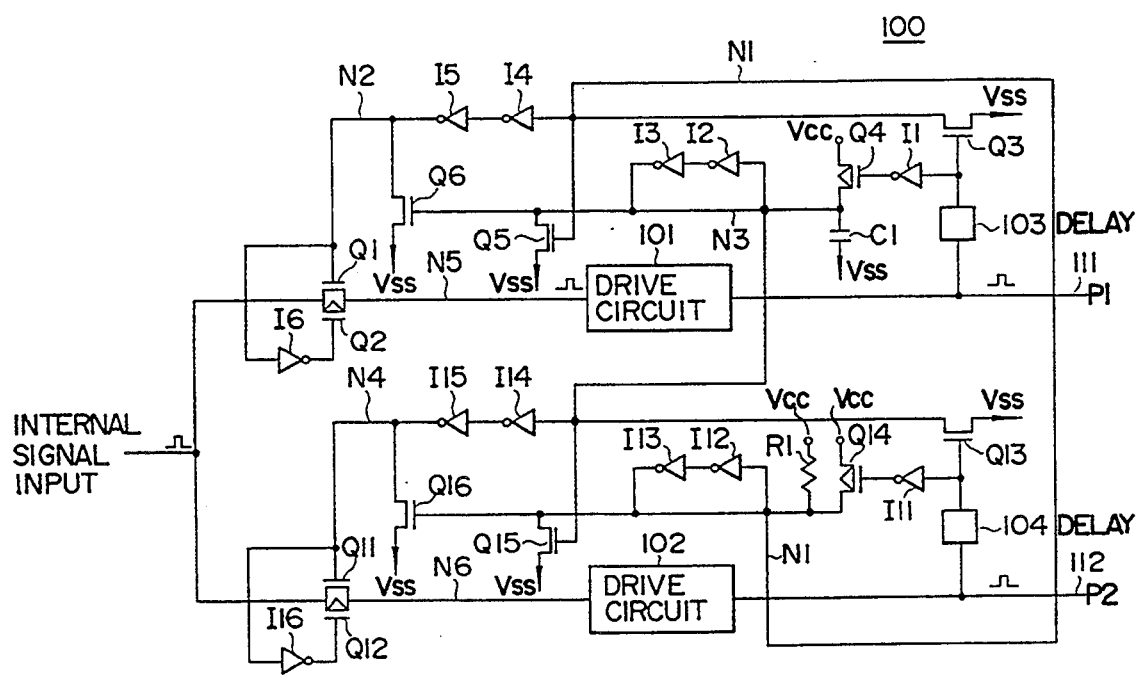
FIG. 7 is a circuit diagram showing one example of a detailed configuration of a selector drive circuit used in the circuit of FIG. 1.

FIG. 6 shows the operation of the present invention and FIG. 7 shows the detailed circuit configuration of the selector drive circuit 100 shown in FIGS. 5A and 5B. Moreover, for the sake of simplification of description, the examples shown in FIG. 6 and FIG. 7 have two drive circuits, and there are two wirings that transmit these activation signals for activation. More specifically, when the internal clock waveform that is caused by the external input change is input to the selector drive circuit 100, the selected activation signals P1, P2 are output via the respective wirings 111, 112. The activating portions (high level parts) of the signals P1 and P2 are not overlapped with each other.

Referring to FIG. 7, the internal input signals are respectively input to the drive circuits 101, 102 via the transfer gate comprising a P-channel MOS transistor Q12 and an N-channel MOS transistor Q11 that have an inverter I16 connected between the sources thereof, and a transfer gate comprising a P-channel MOS transistor Q2 and an N-channel MOS transistor Q1 that have an inverter I6 connected between the sources thereof. To the output sides of both drive circuits are respectively connected the wirings 111, 112. The drive circuits, for example, consist of a two stage inverter chain.

First, the output of the drive circuit 101 is delayed by the delay circuit 103, and is applied to the gate of the P-channel MOS transistor Q4 after being inverted by the inverter I1. The source of this transistor Q4 is connected to the power source and the drain is grounded via the capacitance C1. To the drain are connected the gate of the N-channel transistor Q6 and the drain of the N-channel transistor Q5. In addition, two-stage inverters I2 and I3 are connected between a connection node of the drain of transistor Q4 with the drain of the transistor Q5 and the gate of the transistor Q6. The output of the delay circuit 103 is applied to the gate of the N-channel transistor Q3. The drain of this transistor Q3 is connected to the gate electrode of the transistor Q5 and the drain of the transistor Q14. The drain of the transistor Q3 is also connected to the gate of the transistor Q1 and the drain of the transistor Q6, via two-stage inverters I4 and I5. In the same manner, the output of the drive circuit 102 is delayed by the delay circuit 104 and is applied to the gate of the P-channel MOS transistor Q14 after it has been inverted by the inverter I11. The source of this transistor Q14 is connected to the power source and the drain is connected to the power source via the resistor R1. To the drain of the transistor Q13 are connected the drain of the N-channel transistor Q15 and the gate of the N-channel transistor Q16. In addition, the two stage inverters I12 and I13 are connected to the drain of the transistor Q14, the drain of the transistor Q15, and the gate of the transistor Q16. The output of the delay circuit 104 is applied to the gate of the N-channel transistor Q13. The drain of this transistor Q13 is connected to the gate electrode of the transistor Q15 and the drain of the transistor Q16. The drain of the transistor Q13 is also connected to the gate of the transistor Q11 and the drain of the transistor Q16, via two-stage inverters I14 and I15. Then, the drain of the transistor Q14 is connected to the common contact of the gate of the transistor Q5 and the drain of the transistor Q3, and the drain of the transistor Q4 is connected to the common contact of the gate of the transistor Q15 and the drain of the transistor Q13.

The operation of this circuit will be described.

When power is applied to the selector drive circuit 100 since the node N1 is pulled up through the resistor R1, the node N1 becomes the H level for certain settling conditions for the capacitor C1 and the resistor R1 shown in FIG. 7, and this cause the node N2 to become the set status and the node N4 to become the reset status. Moreover, in this status, the transistor Q1 and Q2 are in the on status and the transistors Q11 and Q12 are in the off status. An internal clock waveform occurs due to changes in the external input and the drive circuit 101 is started via the node N5 of the selector circuit, and the activation signal P1 is output to the wiring 111. The output of this activation signal P1 delays and turns on the transistors Q3 and Q4 and the node N1 becomes the L level, the node N3 becomes the H level, and the node N2 shifts from the set status to the reset status.

In addition, the node N3 becomes the H level and so the node N4 shifts from the reset status to the set status.

The internal clock waveform caused by the next external input change starts the drive circuit 102 via the node N6 of the selector drive circuit, and the activation signal P2 is output to the wiring 112. The output of activation signal P2 turns on the transistors Q13 and Q14 and the node N3 becomes the L level and the node N1 becomes the H level so that the node N2 once again becomes the set status.

The operation described above is repeated when the next internal clock waveform occurs. When there is operation of a selector drive circuit 100 such as this at a certain cycle time, the activation signals P1 and P2 are generated alternately for each cycle and so the cycle time of a single wiring becomes two cycle time portions. Accordingly, the mean current ai flowing in a single wiring is reduced to one half when compared to the conventional operation for a single cycle, the current density ai/w of the wiring is reduced and the reliability is improved.

Moreover, the configuration of the selector drive circuit 100 used in the present invention is not limited to that of the embodiment shown in FIG. 7, as if activation signals are supplied at different cycles and with respect to successive n number of wirings in accordance with the change in the internal waveform input, then it is possible to use another circuit configuration in accordance with necessity.

As has been described in detail and with reference to the embodiments, the present invention is provided with n number of activation signal transmissions, and a selector drive circuit is provided to successively select and drive these. So it is possible to reduce the mean current without any loss of high integration or high speed of the metal wiring when there are large capacities and high levels of fineness. Accordingly, it is possible to lower the current density of activation signals that flow in the wiring and, therefore, improve the reliability of the metal wiring.

What is claimed is:

1. A semiconductor integrated circuit comprising:

n number of operating circuits that operate at a predetermined time interval, wherein n is a positive integer;

a number of wirings respectively connected to said n number of operating circuits; and selective drive means comprising n number of input signal pass means for passing an input signal, n number of driver means for receiving an input signal from said input signal pass means for outputting an activation signal, and n number of pass control means for controlling said input signal pass means in response to a rise of power supply voltage at power on, the selective drive means responsive to only one input signal for generating activation signals and transmitting said activation signals to said n number of wirings in order to activate said operating circuits in different cycle times, the activating portions of said activation signals not being overlapped with each other;

wherein each said input signal pass means comprises a transfer gate having a pair of transistors of opposite conductivity types, one of said pass control means comprising a capacitor for controlling one of said input signal pass means to one state which permits passing said input signal, and another of said pass control means comprises a resistor for controlling another of said input signal pass means to another state which permits passing said input signal.

2. The semiconductor integrated circuit according to claim 1, wherein at power on, said capacitor lowers a first control signal applied to one of said transfer gates to ground level and said resistor pulls up a second control signal applied to another of said transfer gates to the power supply voltage level.

* * * * *